United States Patent
Lechter et al.

(10) Patent No.: US 6,204,661 B1
(45) Date of Patent: Mar. 20, 2001

(54) DETECTOR FOR PERIODIC MAGNETIC FIELD

(75) Inventors: Robert Lechter, Hollywood, FL (US); Mark Kettering, San Luis Obispo, CA (US)

(73) Assignee: Tech International Corp., Hallendale, FL (US)

(*) Notice: Subject to any disclaimer, the term of this patent is extended or adjusted under 35 U.S.C. 154(b) by 0 days.

(21) Appl. No.: 09/163,900

(22) Filed: Sep. 30, 1998

(51) Int. Cl.[7] .................................................. G01R 33/02
(52) U.S. Cl. ............................................. 324/225; 324/257
(58) Field of Search ................................... 324/257, 244, 324/225, 258

(56) References Cited

U.S. PATENT DOCUMENTS

| | | | |
|---|---|---|---|
| 3,760,230 | * 9/1973 | Henderson | 317/27 R |
| 4,277,744 | 7/1981 | Audone et al. | 324/72 |
| 4,303,886 | 12/1981 | Rhodes | 324/255 |
| 4,362,992 | 12/1982 | Young et al. | 324/247 |
| 4,527,123 | 7/1985 | Gilman et al. | 324/254 |
| 4,605,899 | 8/1986 | Eumurian et al. | 324/258 |
| 4,634,969 | 1/1987 | Edlin et al. | 324/95 |
| 4,635,207 | 1/1987 | Payne | 364/484 |
| 4,675,606 | 6/1987 | Ganguly | 324/244 |
| 4,714,880 | 12/1987 | Charmet | 324/258 |
| 4,724,390 | 2/1988 | Raushcher et al. | 324/344 |
| 4,777,644 | 10/1988 | Butterworth et al. | 379/1 |
| 4,906,929 | 3/1990 | Rempt | 324/244 |
| 4,913,153 | 4/1990 | Hagmann et al. | 128/653 R |
| 4,933,637 | 6/1990 | Ueda et al. | 324/253 |
| 4,954,812 | 9/1990 | Lebron | 340/551 |
| 5,150,051 | 9/1992 | Friedman et al. | 324/258 |
| 5,256,960 | 10/1993 | Novini | 324/72 |
| 5,283,522 | 2/1994 | Corby, Jr. | 324/244 |
| 5,311,130 | 5/1994 | Bill et al. | 324/258 |
| 5,376,245 | 12/1994 | McLeod | 204/155 |
| 5,621,522 | 4/1997 | Ewing et al. | 356/301 |

\* cited by examiner

*Primary Examiner*—Christine Oda
*Assistant Examiner*—Henry S. Andersen
(74) *Attorney, Agent, or Firm*—Akerman Senterfitt

(57) ABSTRACT

A detector for a magnetic field having a low frequency compared to background EMF and having a magnitude approximately 1,000 times less than the EMF, the detector comprising: a pickup coil for capturing the magnetic field and the background EMF; an integrator coupled for receiving a signal having respective components representative of the magnetic field and the background EMF, the integrator having a time constant such that successive positive and negative polarity portions of the component representative of the background EMF cancel out one another in the integrator, but the component representative of the magnetic field results in a net output signal from the integrator, the net output signal being indicative of the magnitude of the magnetic field; and, a magnetic field strength output indicator responsive to the net output signal from the integrator, whereby the magnetic field can be detected with great sensitivity notwithstanding the background EMF.

6 Claims, 4 Drawing Sheets

DETECTOR FOR PERIODIC MAGNETIC FIELD

BACKGROUND OF THE INVENTION

1. Field of the Invention

This invention relates generally to the field of detecting magnetic fields, and in particular, to detecting the magnetic field resulting from the rotation of large magnets in a medical treatment device.

2. Description of Related Art

Certain medical treatment devices utilize large rotating magnet(s) weighing, for example, several ounces. One example is the Magboy device, which is designed to be rolled over a part of the body and thus generate a magnetic field which can be therapeutic for certain injuries and pathologies. It is important during treatment to be certain that the magnetic fields produced by the device are of sufficient strength as applied to the patients. In some cases, it is important first to demonstrate that such a magnetic field is produced in the first instance. One would expect that a conventional magnetic field detector utilizing a pickup coil, that is a Gauss meter, could be used for monitoring the operation of a Magboy device or a similar device. However, such detectors utilizing pickup coils also detect background EMF fields. EMF is present everywhere in buildings when electrical power is used. One solution is to reduce the sensitivity to the point that no EMF is detected. Unfortunately, it happens that the magnetic field produced by a Magboy device, for example, is much weaker than the background EMF; by a factor of about 1000. Therefore, high sensitivity is critical.

It is also important that a detector be relatively inexpensive to produce and extremely easy to use. Magnetic fields resulting from other kinds of sources need to be detected and a number of detectors of different designs have been developed over the years. Four such detectors are illustrative.

A detector described in U.S. Pat. No. 4,303,886 comprises: magnetic sensor means including first and second windings; drive means, connected to said first winding, for cyclically increasing the magnetic field in said sensor means to a value greater than that value which causes saturation in said sensor means; detection means, connected to said second winding, for providing an output signal whenever the absolute magnitude of signals received from said second winding is greater than a predetermined value; conversion means, connected to said detection means, for providing a bilevel output signal which changes once for each occurrence of an output signal from said detection means; integration means, connected to said conversion means, for providing an apparatus output signal indicative of the non-symmetry history of bilevel output signals received from said conversion means; and, feedback means, connected between said integration means and said drive means, for returning a feedback signal which substantially cancels the effect of an external field being measured. The detection means comprises positive and negative threshold sensors.

A meter for measuring extremely-low-frequency (ELF) electromagnetic fields, described in U.S. Pat. No. 5,150,051, comprises: a coil that produces a coil voltage in response to varying magnetic fields; a filter-integrator circuit connected to receive the coil voltage as its input and having as its transfer function the product of those of a high-pass filter and an integrator, the high-pass filter having a cut-off frequency below 60 Hz and an attenuation at 10 Hz at least 20 db greater than its attenuation at 60 Hz; and, a display circuit responsive to the output of the filter-integrator circuit for generating a visual indication thereof.

A method for measuring a local magnetic signal in the presence of a magnetic noise field, described in U.S. Pat. No. 5,283,522, comprises the steps of: sensing said local magnetic signal and a noise component from said magnetic noise field; modulating said noise component at a first frequency; producing a first signal from said local magnetic signal and said modulated noise component; bandpass filtering said first signal at said first frequency to produce a second signal; demodulating and amplifying said second signal to produce a third signal; and, subtracting said third signal from said first signal to produce said local magnetic signal.

A radiation detector adapted to detect and provide a warning of a presence of radiation having a frequency of about 5 Hertz to about 400,000 Hz, described in U.S. Pat. No. 5,311,130, comprises: coil means for sending said radiation and for producing an alternating electrical current signal when said radiation is sensed; amplifier means, coupled to said coil means, for amplifying said alternating electrical current signal only when said frequency of the sensed radiation is less than about 2,000 Hz, thereby producing an amplified signal; first rectification means, coupled to said coil means, for rectifying said alternating electrical current signal only when said frequency of the sensed radiation is greater than about 2,000 Hz, thereby producing a first direct current signal; second rectification means, coupled to said amplifier means, for rectifying said amplified signal, thereby producing a second direct current signal; summing means, coupled to said first and second rectification means, for summing said first and second direct current signals, thereby producing a summed signal; comparator means, coupled to said summing means, for comparing said summed signal to a predetermined value and for producing a comparison output signal only when said summed signal exceeds said predetermined value; first multi-vibrator means, coupled to said comparator means, for selectively producing a visual alarm signal only when said comparison output signal is produced by said comparator means; and, second multi-vibrator means, coupled to said first multi-vibrator means, for selectively producing an audible alarm signal a predetermined time after said visual alarm signal is produced, thereby cooperating with said first multi-vibrator means to provide a warning of said presence of said radiation.

None of the foregoing references is directed to a method or apparatus which can easily and inexpensively distinguish between the magnetic field produced by a rotating magnet medical treatment device and background EMF, and in so doing, accurately detect and measure the magnetic field from the medical treatment device.

SUMMARY OF THE INVENTION

A Gauss meter incorporates a pickup coil. Electromagnetic and magnetic fields are received, amplified and processed so that increased wave amplitude results in an increase of a meter level reading. Each wave of the field consists of a positive and negative part. The Gauss meter measures the strength of the positive or negative parts, or both parts of the wave. A larger wave indicates a higher EMF level. Since EMF produces a positive signal which is immediately followed by a negative wave, it was recognized in accordance with the inventive arrangements that a distinction between EMF and the kind of signal produced by a Magboy device can be made. An integrator stores signals, both positive and negative. Depending on the time constant of the integrator, the output level of the integrated signal will track the input signal more or less closely, or stated otherwise, the output of the integrator will be more or less a steady state value. If the time constant can be adjusted properly, the negative part of an EMF wave will cancel the integration of a previous positive EMF, or vice versa. As a result, no output indicative of the EMF background EMF signal is produced. Since the EMF waves are quite symmetrical they cancel each other out in a very thorough manner. The signal from the Magboy device, however, being generated by a manual movement, is not at all likely to be symmetrical as is the background EMF, and even if substantially symmetrical, is at a much lower frequency than the EMF. This lower frequency can, for example, be in the range of approximately 2 Hz to 15 Hz, or even 5 Hz to 10 Hz, as compared to the frequency of the EMF, which is substantially 60 Hz. Accordingly, positive and negative parts of a signal from a Magboy device, or similar source, do not tend to cancel out one another in the integrator, and instead result in a net output signal from the integrator which is indicative of the magnetic field from the Magboy device and which can be further processed. The net output signal is also indicative of the rotational speed of the magnets. This signal processing trick makes it possible to extract the unique signal signature which is typical for the Magboy devices, or any other device generating a similar kind of magnetic field, even though the unwanted EMF signal is about 1000 times stronger than the magnetic field signal.

A detector for a magnetic field having a low frequency compared to background EMF and having a magnitude approximately 1,000 times less than the EMF, in accordance with the inventive arrangements, comprises: a pickup coil for capturing the magnetic field and the background EMF; an integrator coupled for receiving a signal having respective components representative of the magnetic field and the background EMF, the integrator having a time constant such that successive positive and negative polarity portions of the component representative of the background EMF cancel out one another in the integrator, but the component representative of the magnetic field results in a net output signal from the integrator, the net output signal being indicative of the magnitude of the magnetic field; and, a magnetic field strength output indicator responsive to the net output signal from the integrator, whereby the magnetic field can be detected with great sensitivity notwithstanding the background EMF.

The integrator can be optimized by adjustment of the time constant to have maximum sensitivity to a magnetic field produced by at least one large rotating magnet.

The detector can further comprise a threshold circuit for equalizing amplitudes of detected magnetic waves to provide uniform operation of the output indicator irrespective of distance of the source from the detector.

The detector can further comprise a first amplifier coupled between the pickup coil and the integrator and/or a second amplifier coupled between the integrator and the threshold circuit. The second amplifier can comprise first and second amplifier stages, the first amplifier stage including an AC bypass signal path.

A method for detecting a magnetic field having a low frequency compared to background EMF and having a magnitude approximately 1,000 times less than the EMF, in accordance with the inventive arrangements, comprises the steps of: capturing the magnetic field and the background EMF; integrating a signal having respective components representative of the captured magnetic field and the background EMF; setting a time constant for the integrating step such that successive positive and negative polarity portions of the component representative of the background EMP cancel out one another during the integrating step, but the component representative of the magnetic field results in a net output signal from the integrating step, the net output signal being indicative of the magnitude of the magnetic field; and, generating a perceptible output indicator of magnetic field strength responsive to the net output signal, thereby detecting the magnetic field with great sensitivity notwithstanding the background EMF.

The method can further comprise the step of optimizing the integrating step by setting the time constant to have maximum sensitivity to a magnetic field produced by at least one large rotating magnet.

The method can also further comprise the step of equalizing amplitudes of detected magnetic waves to provide uniform operation of the output indicator irrespective of distance of the source from the detector.

DETAILED DESCRIPTION OF THE PREFERRED EMBODIMENTS

Figure 1:
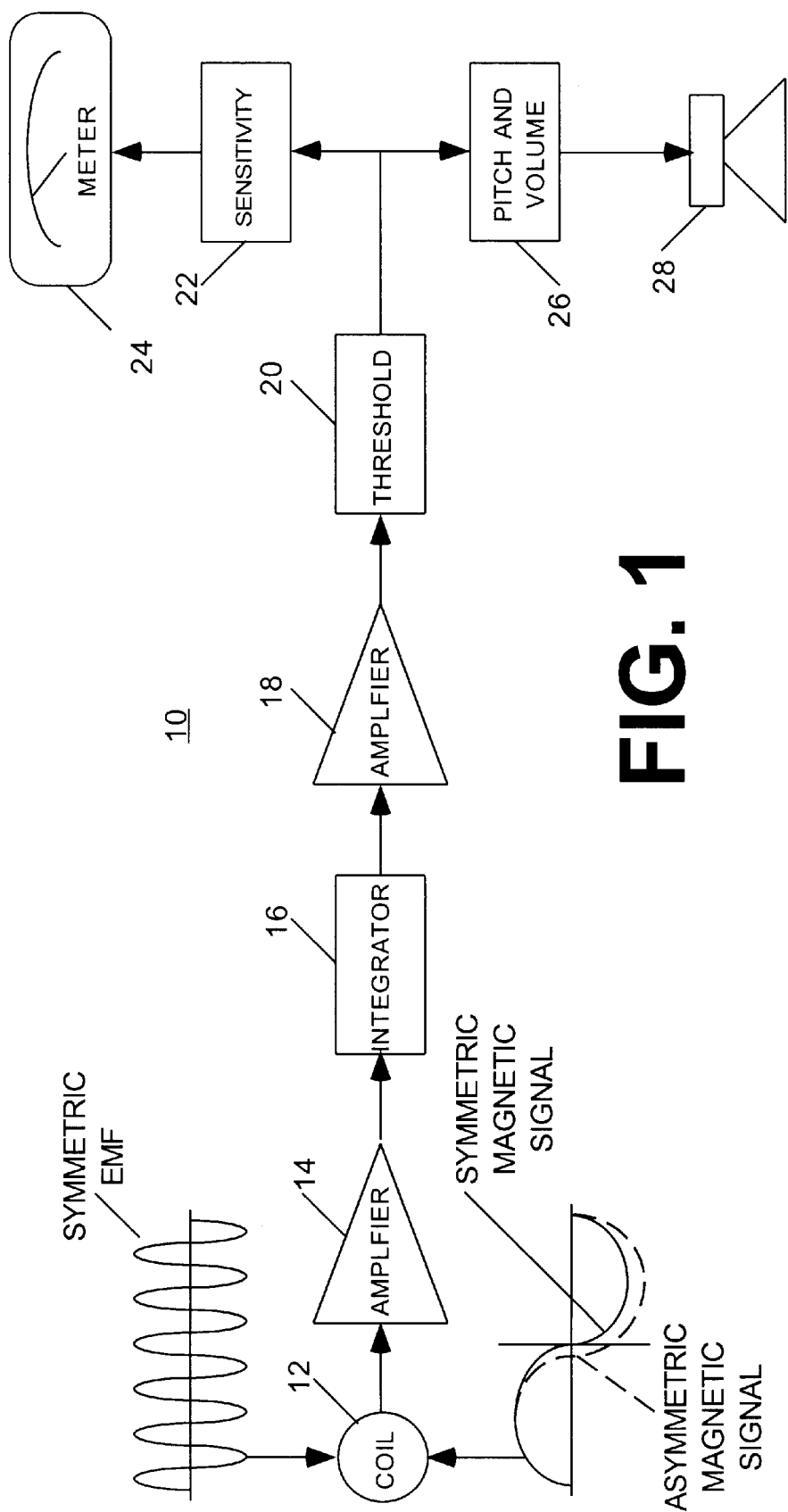
FIG. 1 is a block diagram of a magnetic field detector in accordance with the inventive arrangements.

A magnetic field detector 10 in accordance with the inventive arrangements is shown in block diagram form in FIG. 1. Two input signals can be expected to be captured by the coil antenna 12 as a combined input. One input signal is a background EMF signal, which as shown, is generally symmetric and of a fixed frequency of about 60 Hz. The other input signal is a magnetic field signal, which has a much lower frequency than the EMF signal, for example in the range of approximately 2 Hz to 12 Hz. The magnetic field signal can be symmetric as shown by the solid line representation, but is more likely asymmetric as shown by the dashed line representation. The asymmetry can be in frequency or amplitude, or both.

The input signal is amplified by an amplifier 14 and the amplified signal, still combined, is supplied to an integrator 16. The integrator 16 has a time constant which enables the 60Hz symmetric component of the combined signal representing the background EMF to be effectively canceled out, so that the component representing the magnetic field, which has a much lower frequency and is most likely not symmetric, is substantially the only source of a net output from the integrator 16. The integrator thus functions as a very low pass filter.

The output of the integrator, which represents the detected magnetic field signal, is very weak. Accordingly, the output of the integrator is amplified by an amplifier 18. The output of the amplifier is an input to a threshold circuit 20.

The threshold circuit 20 equalizes the detected magnetic waves in terms of amplitude, without sacrificing the frequency information indicative of rotation. In other words, the threshold circuit 20 equalizes the detected magnetic field signal with respect to distance from the signal source. The frequency information is indicative of the rotational speed of the magnets and is the preferred basis for controlling the output indicators. Since magnetic fields diminish with the square of distance from the source, the signal strength, or intensity, falls off rapidly. If the source is twice distance from the pickup coil 12, the signal is 4 times weaker. Still, a meaningful signal should be indicated although the signal strength can vary by a factor of approximately 10,000. It is preferred, as noted, that the output indicators always indicate each revolution of the rotating magnets. The threshold circuit equalizes the detected signals so that the output indicators represent only the rotational speed of the rotating magnetic source, rather than the distance of the detector from the source.

The output of the threshold circuit is an input to at least one, and preferably two output indicators, one visual and the other audible. A sensitivity circuit 22 drives a meter 24 responsive to the output of the threshold circuit 20. The meter is calibrated and adjusted to indicate the rotation speed of the rotating magnets, the meter deflection increasing with increased rotational speed, provided that a magnetic field is detected at all. The sensitivity circuit 22 and meter 24 can be implemented conventionally.

A pitch and volume control circuit 26 drives a loudspeaker 28. A sound is produced for each revolution of the rotating magnets in the source, so that the pitch of the output sound increases with the increased rotational speed, while the volume is preferably adjusted to remain relatively constant, provided that a magnetic signal is detected at all. The pitch and volume control 26 and the loudspeaker 28 can also be implemented conventionally.

Figure 2:
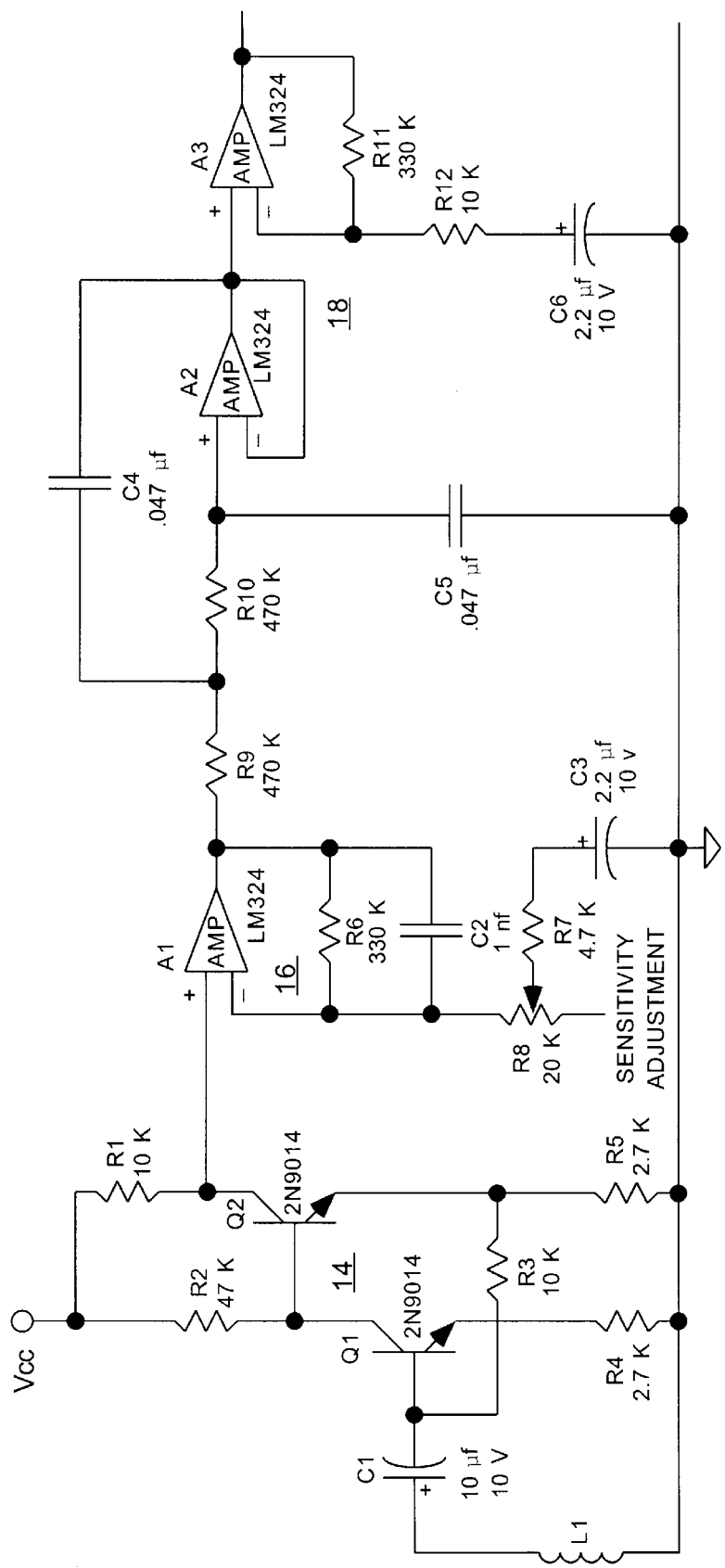
FIG. 2 is a circuit schematic of certain portions of the magnetic field detector shown in FIG. 1.

A circuit schematic for the coil 12, amplifier 14, integrator 16, amplifier 18 and threshold circuit 20 is shown in FIG. 2. The output of the pickup coil L1 (12) is coupled to the base of transistor Q1 through capacitor C1, which assists in biasing transistor Q1. Transistor Q1 and transistor Q2 form a two stage amplifier (14), biased by resistors R1, R2, R3, R4 and R5 as indicated. Resistors R1 and R2 are coupled to a source of regulated voltage Vcc. The detector can be conveniently energized by a replaceable 9 volt battery, not shown. The collector output of transistor Q2 is an input to operational amplifier A1, which together with resistor R6 and capacitor C2, form the integrator 16. Resistor R7 and variable resistor R8 form a sensitivity adjustment which varies the time constant of the integrator. Resistor R7 is coupled to ground through capacitor C3.

The output of operational amplifier A1 (16)is coupled to the input of operational amplifier A2 through resistors R9 and R10. Resistor R10 and capacitor C5 form another resistive-capacitive filter, whereas capacitor C4 enables an AC component to bypass the operational amplifier A2. Resistors R9 and R10 form a voltage divider which determines the amplitude of the bypassed component. The output of operational amplifier A2 is an input to operational amplifier A3, which has as it positive input the output of operational amplifier A2 and the bypassed AC component through capacitor C4. Resistor R11 provides a feedback loop to the negative input and further biasing and filtering is provided 20A by resistor R12 and capacitor C6. Operational amplifiers A2 and A3, and the components associated therewith, form amplifier 18.

Figure 3:
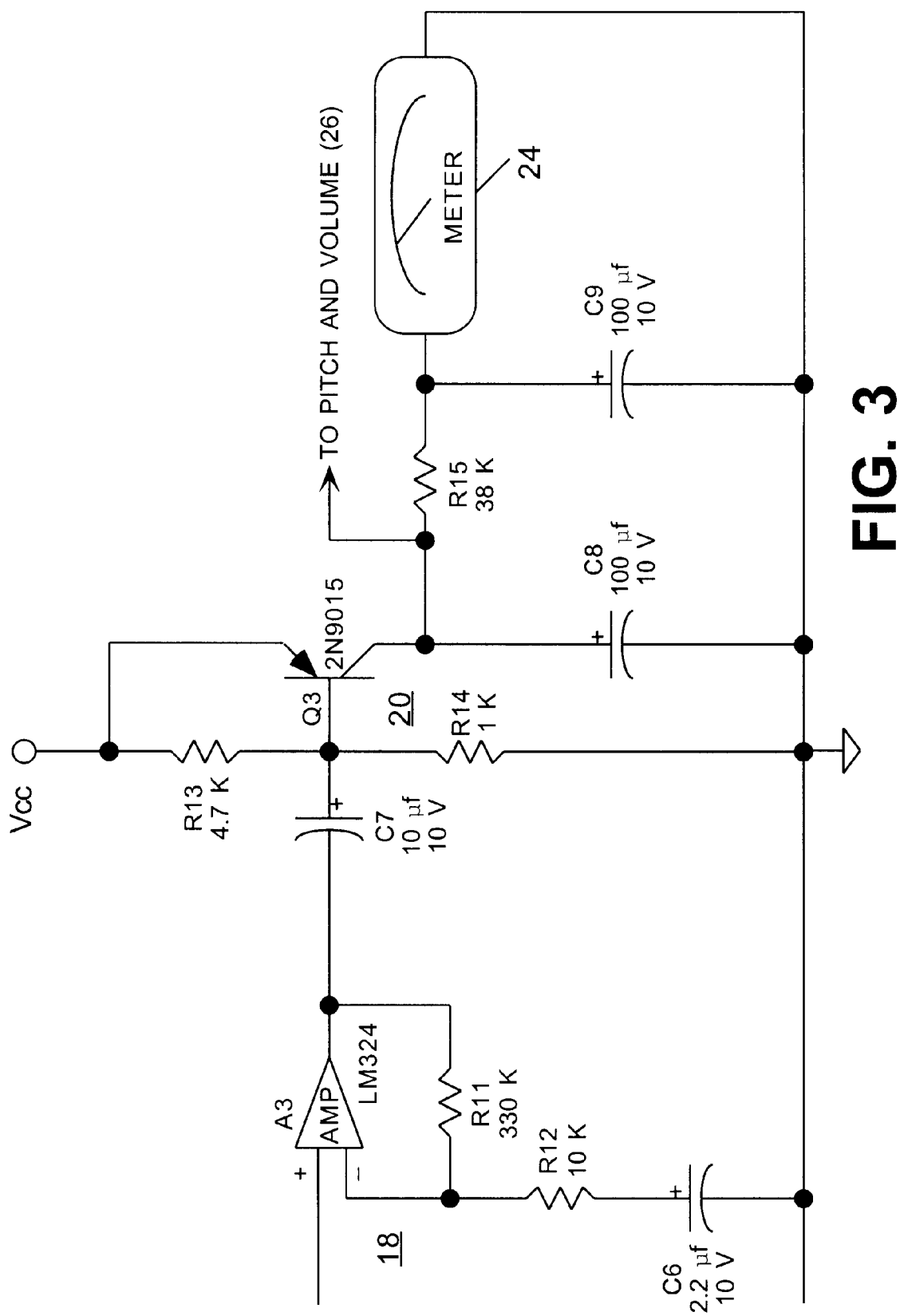
FIG. 3 is a circuit schematic of another portion of the magnetic field detector shown in FIG. 1.

A circuit schematic for the threshold circuit 20 is shown in FIG. 3. The output of operational amplifier A3 is an input to capacitor C7. Capacitor C7 AC couples the output of operational amplifier A3 to the base of transistor Q3. The AC coupling enables resistors R13 and R14 to bias the base of transistor Q3 and thus independently establish the threshold voltage level. Transistor Q3 and the components associated therewith form the threshold circuit 20.

The output of the threshold circuit, at the collector of transistor Q3, is AC coupled to ground through capacitor C8 for further filtering. This indicator output signal is an input to the pitch and volume control 26. As an example, the audible signal can be generated by an oscillator, not shown, the output of the oscillator being modulated by the indicator output signal. The indicator output signal is also filtered by resistor R15 and capacitor C9, the filtered indicator output signal being supplied as an input to the meter 24.

Figure 4:
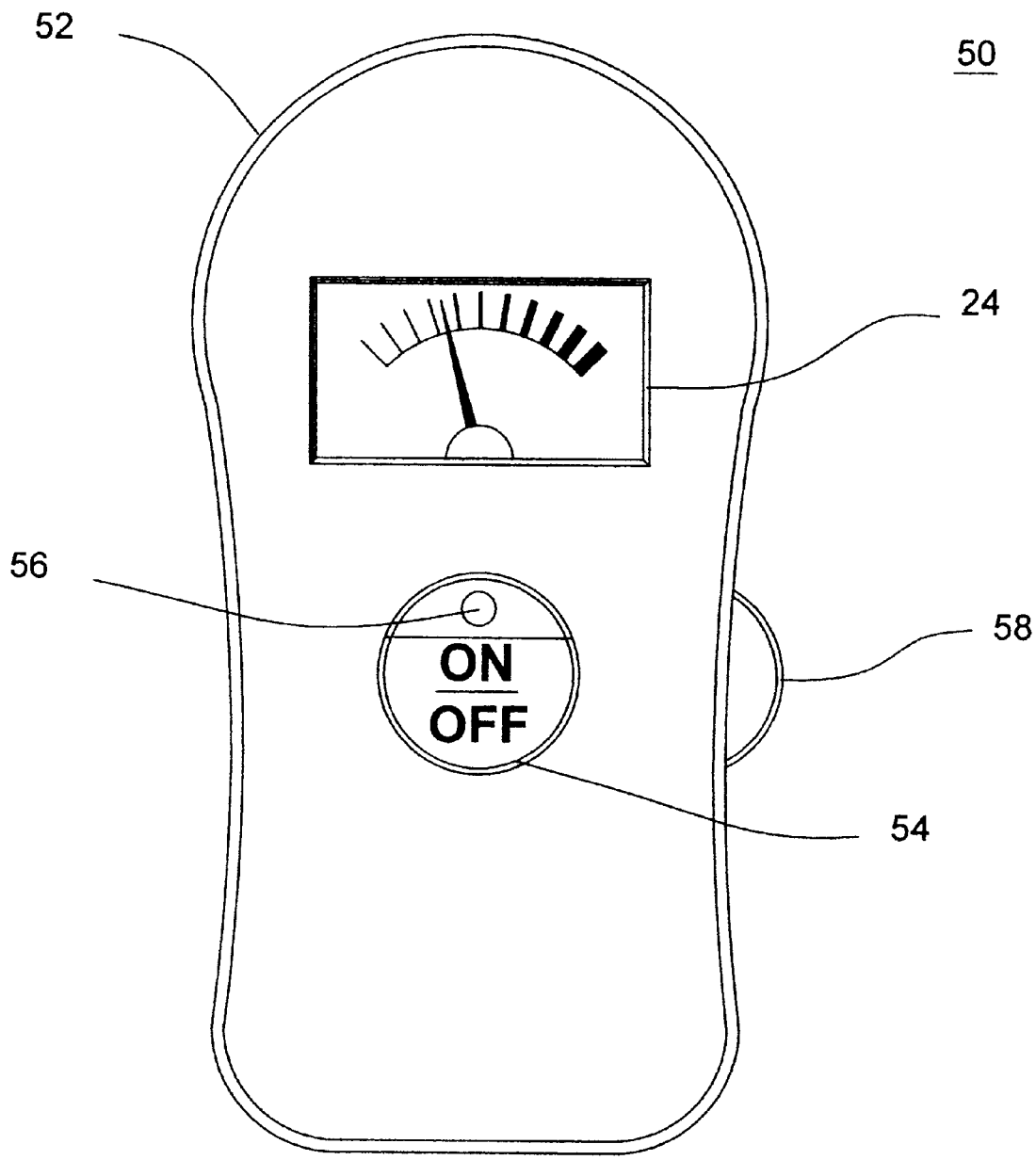
FIG. 4 is a housing for the detector.

The components shown in FIGS. 1–3, as well as those omitted for purposes of clarity, can be conveniently mounted on a circuit board, not shown, disposed in a convenient, hand-held housing 50 shown in FIG. 4 substantially in full scale. The housing 50 can have a cap 52 of a contrasting color, under which the coil 12 is disposed, so that the detector will be properly aimed by a user in an intuitive fashion. The housing includes the meter 24, an ON/OFF push button switch 54, an on indicator light 56, for example a light emitting diode, and a control dial 58 for the volume control 26. The loudspeaker 28 can be mounted on the circuit board and will be easily perceived. In addition, or alternatively, a jack for an earpiece, not shown, can also be provided. A battery cover, not shown, can be provided on the rear side of the housing.

In accordance with the inventive arrangements, extremely weak magnetic fields can be detected with great sensitivity notwithstanding background EMF.

What is claimed is:

1. A detector for a magnetic field having a low frequency compared to background EMF and having a magnitude approximately 1,000 times less than said EMF, said detector comprising:

a pickup coil for capturing said magnetic field and said background EMF;

an integrator coupled for receiving a signal having respective components representative of said magnetic field and said background EMF, said integrator having a time constant such that successive positive and negative polarity portions of said component representative of said background EMF cancel out one another in said integrator, but said component representative of said magnetic field results in a net output signal from said integrator, said net output signal being indicative of said magnitude of said magnetic field;

a magnetic field strength output indicator responsive to said net output signal from said integrator; and a threshold circuit for equalizing amplitudes of detected magnetic waves to provide uniform operation of said output indicator irrespective of distance of a source of said detected magnetic waves from said detector, whereby said magnetic field can be detected with great sensitivity notwithstanding said background EMF.

2. The detector of claim 1, further comprising an amplifier coupled between said integrator and said threshold circuit.

3. The detector of claim 2, wherein said amplifier comprises first and second amplifier stages, said first amplifier stage including an AC bypass signal path.

4. The detector of claim 1, further comprising a first amplifier coupled between said pickup coil and said integrator and a second amplifier coupled between said integrator and said threshold circuit.

5. The detector of claim 4, wherein said second amplifier comprises first and second amplifier stages, said first amplifier stage including an AC bypass signal path.

6. A method for detecting a magnetic field having a low frequency compared to background EMF and having a magnitude approximately 1,000 times less than said EMF, comprising the steps of:

capturing said magnetic field and said background EMF;

integrating a signal having respective components representative of said captured magnetic field and said background EMF;

setting a time constant for said integrating step such that successive positive and negative polarity portions of said component representative of said background EMF cancel out one another during said integrating step, but said component representative of said magnetic field results in a net output signal from said integrating step, said net output signal being indicative of said magnitude of said magnetic field;

generating a perceptible output indicator of magnetic field strength responsive to said net output signal; and equalizing amplitudes of detected magnetic waves to provide uniform operation of said output indicator irrespective of distance of a source of said detected magnetic waves, thereby detecting said magnetic field with great sensitivity notwithstanding said background EMF.

* * * * *